United States Patent [19]
Glover et al.

[11] Patent Number: 5,267,122
[45] Date of Patent: Nov. 30, 1993

[54] OPTICAL NETWORK UNIT

[75] Inventors: Hugh B. Glover, Cary; Clifford T. Jones, Raleigh, both of N.C.

[73] Assignee: Alcatel Network Systems, Inc., Richardson, Tex.

[21] Appl. No.: 898,139

[22] Filed: Jun. 15, 1992

[51] Int. Cl.$^5$ .............................................. H05K 7/20
[52] U.S. Cl. ................................. 361/704; 174/50.51; 174/50.52; 361/703; 361/721; 361/827
[58] Field of Search ................... 174/35 R, 37, 39, 50, 174/50.51, 50.52; 361/380, 383-384, 386-389, 392, 394-395, 399, 424, 428

[56] References Cited

U.S. PATENT DOCUMENTS

| | | | |
|---|---|---|---|
| 2,811,574 | 10/1957 | Guerrero | 176/50 |
| 3,264,526 | 8/1966 | Wiggerman | 361/394 |
| 3,315,128 | 4/1967 | Raymond | 361/391 |
| 3,364,395 | 1/1968 | Donofrio et al. | 361/395 |
| 4,337,499 | 6/1982 | Cronin et al. | 361/413 |
| 4,656,559 | 4/1987 | Fathi | 361/394 |
| 4,685,034 | 8/1987 | Tetsu et al. | 361/399 |
| 4,953,058 | 8/1990 | Harris | 361/383 |
| 5,065,278 | 11/1991 | Schultz | 361/383 |
| 5,089,935 | 2/1992 | Ito | 361/383 |

FOREIGN PATENT DOCUMENTS 2052164  1/1981  United Kingdom ................ 361/383

OTHER PUBLICATIONS

Gunter, John R., A Future Switched Video System., Feb. 1990, IEEE LCS Magazine, pp. 66-72.

Sato, Aoyagi and Kitami, Fiber Optic Analog-Digital Hybrid Signal Transmission Employing Frequency Modulation, IEEE Transactions on Communications, vol. Com-33, No. 5, May 1985.

Lo, Charnes N., A Hybrid Lightwave Transmission System for Sub-Carrier Multiplexed Video and Digital B-ISDN Services in the Local Loop, Journal of Lightwave Technology, vol. 7, No. 11, Nov. 1989, pp. 1839-1848.

Grubb and Robinson, A High-Quality Switched FM Video System, 1990 IEEE LCS Magazine, pp. 53-59, Feb. 1990.

*Primary Examiner*—Gregory D. Thompson
*Attorney, Agent, or Firm*—Ware, Fressola, Van Der Sluys & Adolphson

[57] ABSTRACT

An optical network unit for field installation adjacent to an optical fiber transmission line, for separating multiplexed video and telephony signals for delivery to subscribers residences as electrical signals over metallic drop cables, has a hollow housing formed of heat-conductive material. The unit has a sealing front cover and rear cover, a cable entrance port for cable connections, and a backplane assembly mounted in the housing which incorporates optical-to-electrical signal conversion components and connectors for electrical signals. Slots are formed in the interior surfaces of the housing for positioning a plurality of printed circuit board cards for sliding installation into electrical contact with the backplane assembly. Internal fins each protruding from the housing into its hollow interior adjacent to one of the printed circuit board cards, promote heat dissipation from the cards via the internal fins to the exterior walls of the housing for cooling by external cooling fins exposed to the ambient atmosphere.

18 Claims, 8 Drawing Sheets

WALL-MOUNTED ONU

FIG. 11

PEDESTAL-MOUNTED ONU

UNDERGROUND ONU

FIG. 12

ONU COVER OPTION NO. 1

FIG. 13

ONU COVER OPTION NO. 2

OPTICAL NETWORK UNIT

CROSS-REFERENCE TO RELATED APPLICATION

This application describes an Optical Fiber Network Unit useful in optical fiber transmission systems of the kind described in co-pending U.S. patent application Ser. No. 07/738,327 filed Jul. 31, 1991.

BACKGROUND OF THE INVENTION

1. Field of the Invention

The present invention relates to an optical fiber network that provides both broadband switched video services and narrowband telephony signals over a single fiber using a single optical carrier, and more particularly, to an optical network unit located in subscriber neighborhoods for the purpose of converting optical signals to electrical signals and for providing metallic drops to the various subscribers.

2. Description of the Prior Art

The rapid proliferation of optical fiber telecommunications systems has made possible the provision of broadband services to individual subscribers on a relatively universal basis. Such broadband services often include data transmission; however, there is a broader market for the distribution of video signals over the telecommunications network.

The provision of such video services has long been desired; however, the previously proposed systems have all been subject to various deficiencies which have prevented their commercial acceptance. Video signals may be broadcast to all subscribers over optical fibers; however, this severely limits the programming selection and the number of channels that may be available to each subscriber. A switched video architecture allows for the provision of significantly more programming options and control of distribution only to authorized subscribers.

The concept of switched video transmission systems has been proposed in the past; however, most proposals have had undesirable features. Most proposed switched video architectures require the use of a second optical fiber to distribute the broadband services or, as an alternative, the use of a wavelength division multiplexing system. Such systems do not offer a truly integrated architecture, wherein a single fiber distributes both narrowband and broadband signals and the systems are not integrated with respect to both control and cost effective utilization of common electronics.

An article entitled: "A Future Switched Video System" by John R. Gunter, *IEEE LCS Magazine*, February, 1990, at page 66 and following, describes the desirability of providing video services over the telecommunications network. Another article entitled: "A High-Quality Switched FM Video System" by David E. Robinson and David Grubb, III, *IEEE LCS Magazine*, also published February, 1990, at page 53 and following describes a proposed system architecture wherein the various video channels are frequency multiplexed onto a carrier; however, the carrier uses wavelength division multiplexing for upstream and downstream transmissions.

Other articles describing the simultaneous transmission of narrowband and broadband signals are as follows: "A Hybrid Lightwave Transmission System for Subcarrier Multiplexed Video and Digital B-ISDN Services in the Local Loop", by Charles N. Lo, *Journal of Lightwave Technology*, Vol. 7, No. 11, November 1989, pp. 1839–1848; and "Fiber Optic Analog-Digital Hybrid Signal Transmission Employing Frequency Modulation", by K. Sato et al, *IEEE Transactions on Communications*, Vol. COM-33, No. 5, May 1985, pp. 433–441.

In these networks, the Optical Network Unit (ONU) receives power from a local power cable, and both broadband switched video signals and narrowband telephony signals delivered over a single optical fiber. The ONU serves as the distribution unit, separating and converting the arriving signals into independent electrical signals, which are then delivered as video signals over co-axial cables and telephony signals. over twisted pair cables to nearby subscribers, residences.

Considerable heat builds up in the sealed, moisture proof and air-tight ONU enclosures, which may be underground, mounted above ground on walls, poles or pedestals, or strand-mounted, suspended from the overhead cable. To avoid overheating, means are needed to conduct heat to the outer surfaces of the ONU enclosures, where it can be dissipated to the surrounding ambient atmosphere.

SUMMARY OF THE INVENTION

The present invention achieves the desired heat dissipation in a truly integrated fiber optic telecommunications network simultaneously providing switched video and standard narrowband telephone services. The system is integrated in that it transmits video services on the same fiber as the narrowband services and uses common equipment to support both services.

The ONU's of the present invention are useful, for example, with optical fiber network systems in which a SONET OC-1 (51.84 Mb/s) or OC-3 (155.52 Mb/s) feeder provides the digital transport link from the Central Office (CO) equipment to the Remote Terminal (RT) sites. This system is adaptable for use with Universal Digital Loop Carrier arrangements or for Integrated Digital Loop Carrier arrangements. Such a system uses a star distribution network where the optical fibers radiate from the RT to active Optical Network Units (ONU) via point to point optical links, with each residential ONU serving up to eight living units with three DSO (64 Kb/s) channels. For residential applications two channels are typically used to provide Plain Old Telephone Service (POTS), with the third channel reserved for future applications such as the D-channel for Integrated Services Digital Network (ISDN). An ONU designed for business applications could provide more channel capacity and services per ONU than the residential ONU.

A non-blocking switch fabric is built into the RT core module to allow subscriber channels from the ONUs to be loaded and groomed over the RT to CO feeder for optimum capacity and ease of administration.

These systems permit delivery of switched video services, which services include basic programming, premium programming, Pay-Per-View (PPV), Impulse-Pay-Per-View (IPPV) and Video-On-Demand (VOD) from multiple service providers. The technology used allows either analog or digital television signals to be delivered to the subscriber. The switched video technology allows the subscriber to select from a range of typically up to 192 different programming channels. Using a broadcasting technique, this many program channels could not be simultaneously provided to the subscriber residents without prohibitive expense due to the required bandwidth.

The frequency spectrum reserved for the video channels from the RT to the ONU over a fiber is from 60 to 780 MHz, which supports twenty-four, 30 MHz wide, channels per ONU. At each ONU, video service is available for up to eight living units, with six channels each reserved for each living unit. Thus, each of the eight living units can subscribe to and receive one to six simultaneously switched video channels.

The present invention contemplates an ONU located in a subscriber's neighborhood which functions to terminate the optical transmission and to provide metallic conductor transmission to the actual subscriber premises. The optical fiber from the remote terminal to the ONU carries narrowband baseband telephony signals, and also multiplexed therewith broadband video channels. Thus, the ONU also includes an optical distribution unit which receives the optical signal from the distribution fiber and performs an opto-electrical conversion to convert the optical signal to an electrical signal, after which the electrical signal is demultiplexed into the baseband telephony signals and the broadband video channel signals. The telephony signals are provided to the line circuits for providing metallic drops to the subscribers.

The broadband video channels are provided to switched video distribution card units (SVD and SVDR) for dividing the video channels to the subscribers that have requested the particular channels.

The ONU includes an ONU Test Unit (OTU) which is provided to perform testing of subscriber lines in a manner similar to the Remote Measurement Unit (RMU) typically installed at the remote terminal. The OTU performs a simplified subset of the full set of RMU test functions and actually reports only pass-fail results to the system controller. The ONU may also have provision to provide upstream video back to the remote terminal for further distribution. The ONU can also perform an important function in gathering and processing video control channel data, such as channel selection requests from subscribers, and forwarding this data over a DSO channel in the narrowband telephony signals to the remote terminal over the distribution fiber.

A primary object of the present invention is to provide an optical network unit (ONU) located in a subscriber neighborhood for terminating the optical transmission line and converting the optical signals to electrical signals for metallic drops to the subscriber premises, providing optimum cooling for the circuit board components mounted inside the ONU enclosure.

Another object of the invention is to provide such an ONU of simplified and economical construction, supporting many different printed circuit boards and a connected back plane assembly in firmly aligned and connected positions with effective heat transfer and dissipation, requiring no moving parts and no side plates, cross pieces, fasteners or other conventional circuit board guides or cage pieces.

Still another object is to provide such an ONU with a universal mounting kit, adapting the ONU for ground level pedestal mounting, for aerial mounting on a wall, a pole or the overhead cable, or for below ground mounting in a "handhole" underground chamber.

A further object is to provide such an ONU with a removable wiring panel mounted on the outside of the ONU housing, offering a choice of craft interface at a bulkhead connectorization panel on the housing's surface, or at a point more remote from the ONU housing, by having the wiring panel serve as a passive exit port for narrowband, broadband, fiber optic and power cable stubs.

Other objects of the invention will in part be obvious and will in part appear hereinafter.

THE DRAWINGS

For a fuller understanding of the nature and objects of the invention, reference should be made to the following detailed description taken in connection with the accompanying drawings, in which:

FIGS. 8-12 are schematic front elevation views of five alternative ways of mounting the ONU housings of the present invention for use.

FIGS. 16, 17 and 18 are similar perspective views showing ONU housings of this invention with alternative supports.

BEST MODE FOR CARRYING OUT THE INVENTION

The ONU housings of the present invention are air tight and moisture proof containers provided with suitable gaskets, and sealed to avoid the intrusion of outside air or moisture. These ONU enclosures are preferably formed of die cast aluminum, which achieves highly accurate and reproducible dimensions for these die cast housings, assuring that the printed circuit cards and back plane assembly mounted therein will be guaranteed to achieve good mechanical and electrical connections therebetween.

The optical to electrical conversion functions performed inside the ONU housing 20 consume electrical power and produce considerable heat, which is dissipated by the housing construction as hereafter described.

Figure 1:
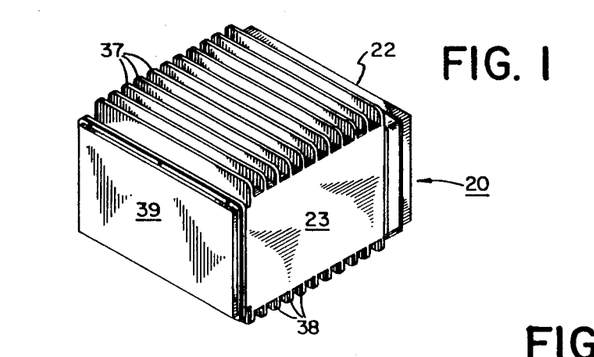
FIG. 1 is a front perspective view of an assembled optical network unit (ONU) housing of the present invention.
Figure 2:
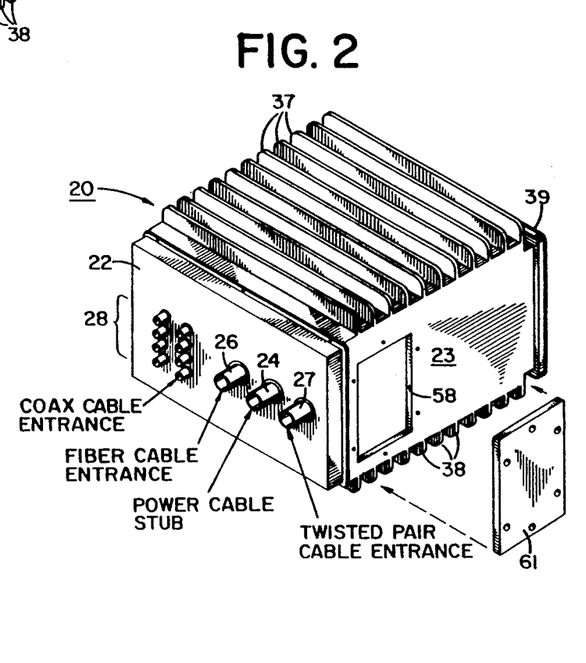
FIG. 2 is a slightly enlarged rear perspective view of the same ONU housing.
Figure 3:
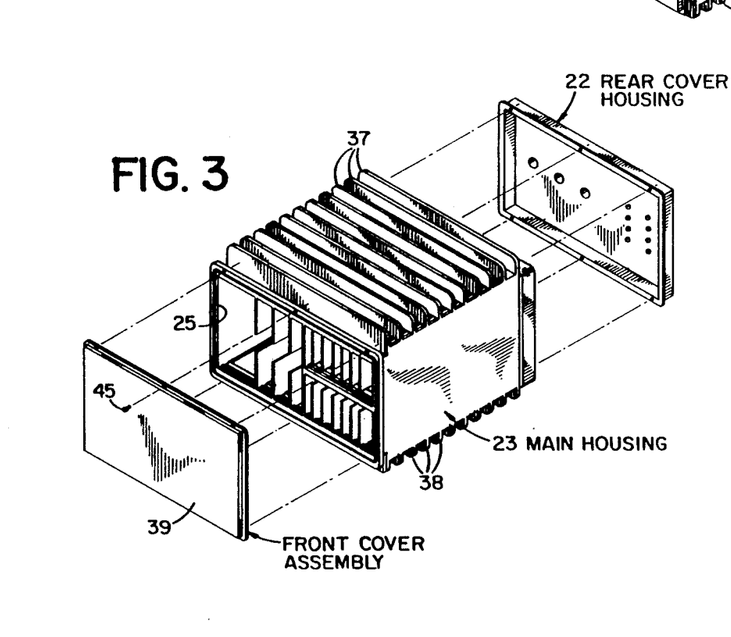
FIG. 3 is an exploded front perspective view, corresponding to FIG. 1, showing the front cover and the rear cover of the ONU housing, both moved away from the main housing to illustrate structural details.
Figure 4:
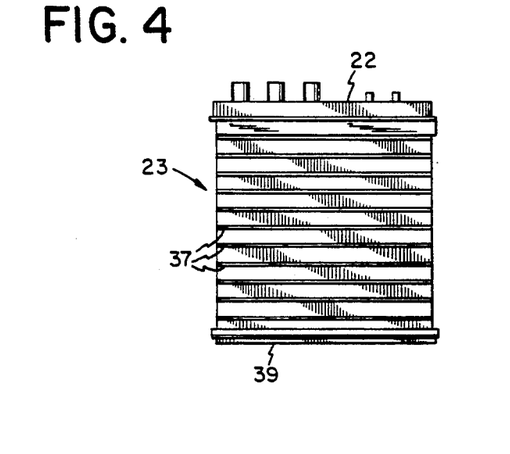
FIG. 4 is a top plan view of the ONU housing.
Figure 5:
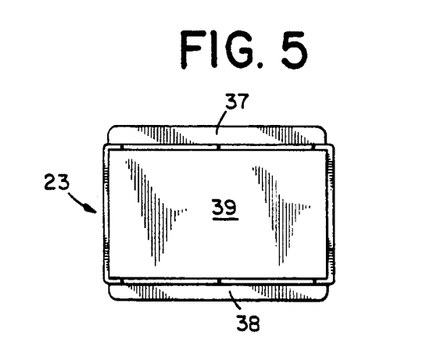
FIG. 5 is a front view of the ONU housing.
Figure 6:
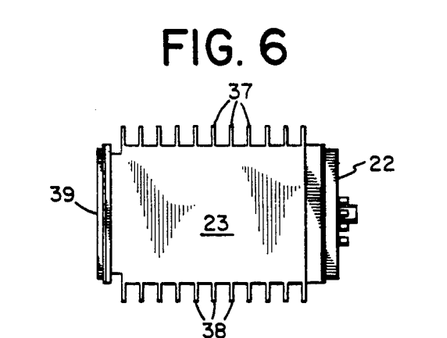
FIG. 6 is a right side view of the ONU housing.
Figure 15:
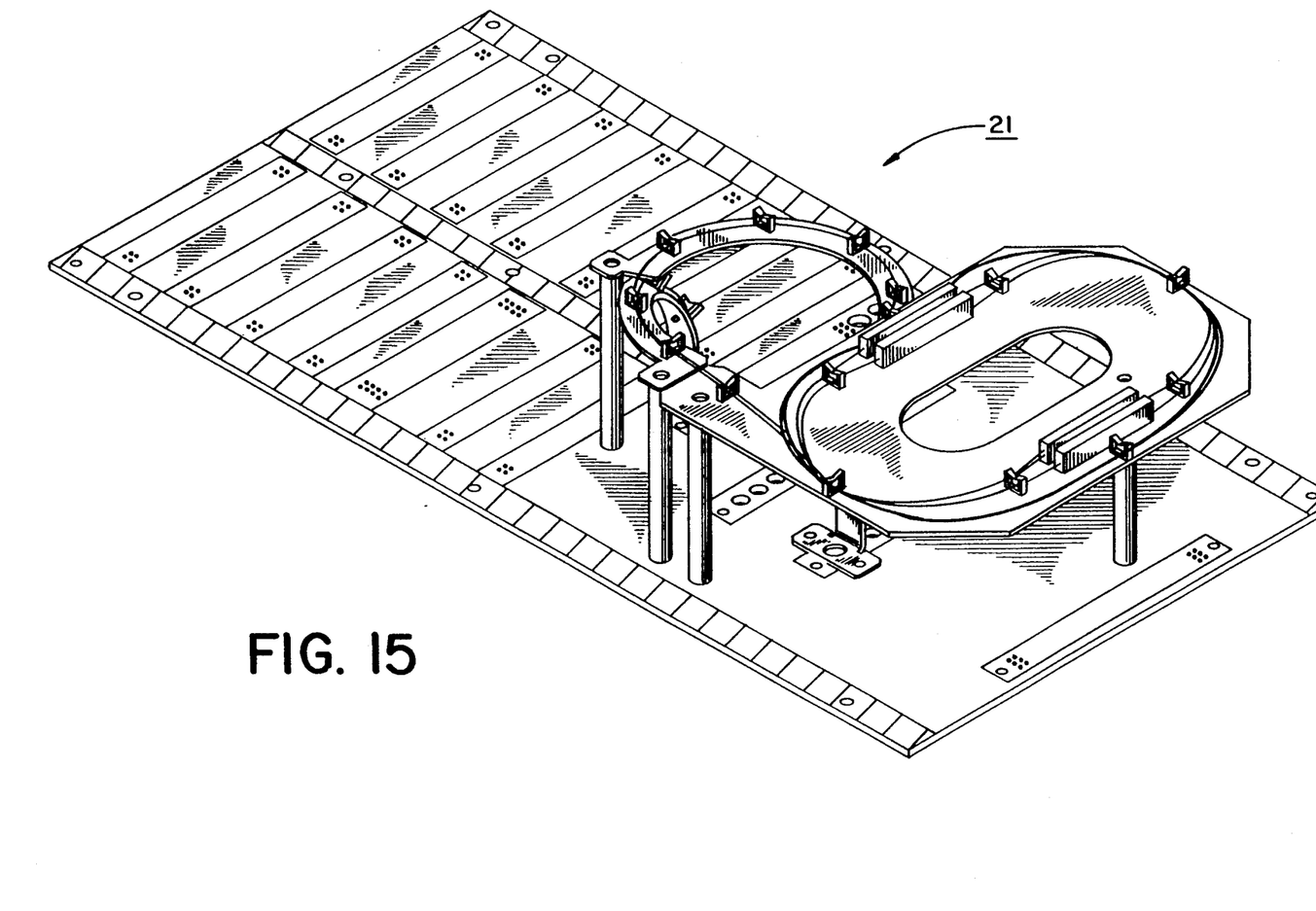
FIG. 15 is a perspective view of a back plane assembly which is installed in the ONU housing inside the rear cover.

A back plane assembly 21 shown in FIG. 15 is mounted inside the rear cover assembly 22 inside main housing 23. As best seen in FIG. 2, the rear cover assembly 22 is provided with a series of entrance and exit ports for the various signal carrying cable components. These include a power cable stub entrance portal 24, a fiber cable entrance portal 26 and two exit portals for metallic electrical conductors delivering signals to the subscriber's premises, a twisted pair cable exit portal 27 and a group of eight coaxial cable exit portals 28.

Figure 7:
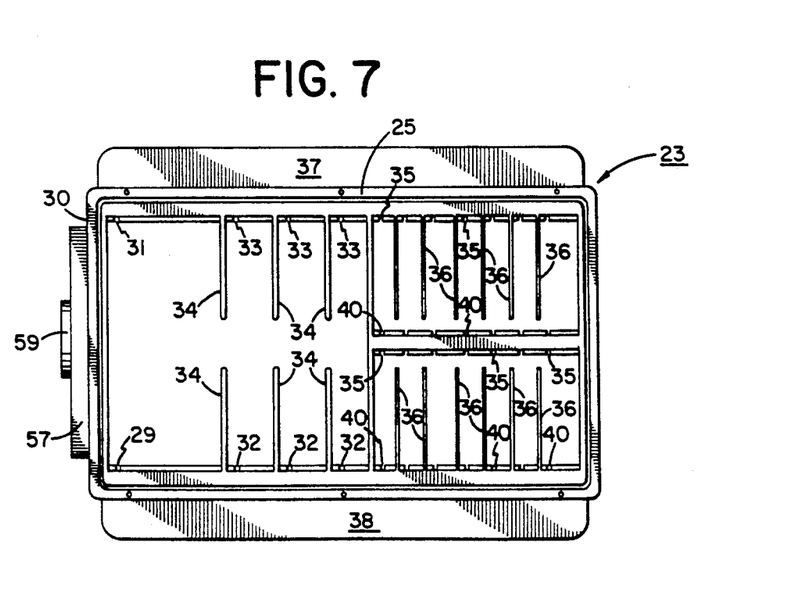
FIG. 7 is an enlarged front view of the ONU housing with the front cover assembly removed, exposing the interior of the main housing viewed from the front.
Figure 19:
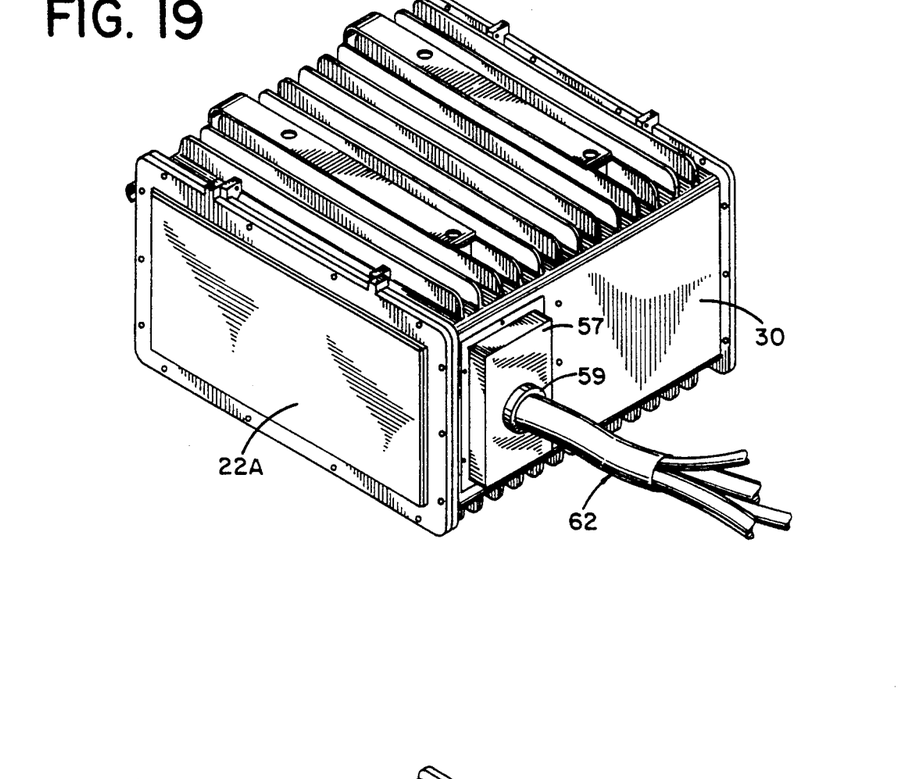
FIG. 19 is a perspective view of an alternative embodiment with a single cable entrance port.
Figure 20:
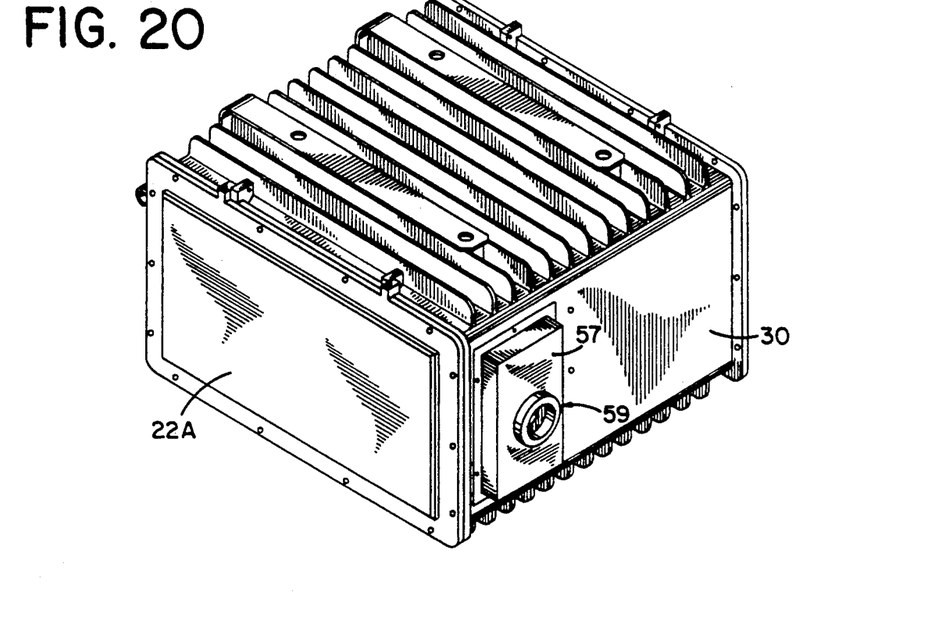
FIG. 20 is a corresponding perspective view of the embodiment of FIG. 19, with the cable removed to show the single entrance port.

An embodiment having an alternative portal configuration is shown in FIGS. 7, 19 and 20. This is a cable entrance plate 57 removably mounted covering a plate aperture 58 (FIG. 2) in the left side wall 30 of housing 23. Plate 57 is provided with a tightly gasketed cable port 59 accommodating bundled individual cables 62 for power, co-axial video, fiber optic and telephony, as shown in FIG. 19. The cable entrance plate 57 itself is clearly shown in FIG. 20, and a non-ported cover plate 61 (FIG. 2) can be substituted for plate 57 if the separate entrance and exit ports 24, 26, 27 and 28 are preferred, in rear cover 22. In the same manner, a plain rear cover plate 22A (FIGS. 19, 20) closes the open rear end of housing 23 when the cable entrance plate 57 is employed.

The various printed circuit boards mounted inside main housing 23 normally include such boards as a test access card (TAC), a line shelf access card (LSA), a line shelf processor (LSP), an ONU port unit (OPU), an ONU test unit (OTU), a broad band interface unit (BIU), an optical distribution unit (ODU), a power card (PWR), a switched video distribution card (SVD), and a switched video distribution receiver card (SVDR). All of these cards and eight line cards, when slidingly inserted into their seated positions, make electrical contact with the back plane assembly 21.

The sliding insertion grooves supporting these various cards are best seen in FIG. 7, where the housing floor and the housing ceiling are provided with matched pairs of grooves such as grooves 29 and 31 closely adjacent to the left hand wall 30 of the main housing 23; three floor grooves 32 and three ceiling grooves 33 vertically aligned close to adjacent vertically extending die cast metal fins 34 extending inwardly into the central portion of housing 23 from the floor and the ceiling in three coinciding vertical planes, closely adjacent to the matched pairs of grooves 32-33.

At the right hand side of housing 23 as shown in FIG. 7, there are two tiers of fourteen additional pairs of upper grooves 35 and lower grooves 40 aligned in vertical planes closely adjacent to corresponding vertical metal fins 36. These sliding card insertion groove pairs position each of the printed circuit board assembly cards in vertical planes closely adjacent to the fins 34 and 36, which are anodized or painted black for heat diffusion purposes. Heat generated in the printed circuit board assemblies is radiated directly to the adjacent fin 34 or 36 and the other interior surfaces of housing 23, and is readily conducted by the fins to the outer shell of housing 23. It will be noted in the figures that both the top and bottom faces of housing 23 are provided with cooling fins 37, 38. These fins 37 on the top surface and 38 on the bottom surface protrude into the surrounding ambient atmosphere. While there are no fans or similar moving parts inside housing 23 to cause any substantial convection air movement therein, the internal fins 34 and 36 receive radiant and convected energy from all heat sources on the adjacent printed circuit boards. This heat is conducted to the outer shell, and radiation and convection from the external protruding cooling fins 37 and 38 provide excellent heat dissipation in the ONU housings of this invention.

After insertion of all of the circuit boards in the sliding insertion guide slots or grooves 29-31, 32-33 and 35-40, the front cover 39 is assembled in position to close the open front face of main housing 23 with a suitable O-ring or sealing gasket 25 and clamped in place. Rear cover assembly 22 is likewise assembled with the main housing 23 after suitable connections have been made to the back plane assembly 21 shown in FIG. 15 firmly anchored connection of the front and back covers with the main housing and the O-rings or sealing gaskets 25 clamped between these components assure that the ONU housing when assembled is completely waterproof and air tight. The ONU housing is intended for outdoor operation and may be submerged under water. It should be noted that the front and rear cover assemblies are secured by captive cover fastening hardware 45 to assure that parts will not be lost during craft interface changes.

Figure 8:
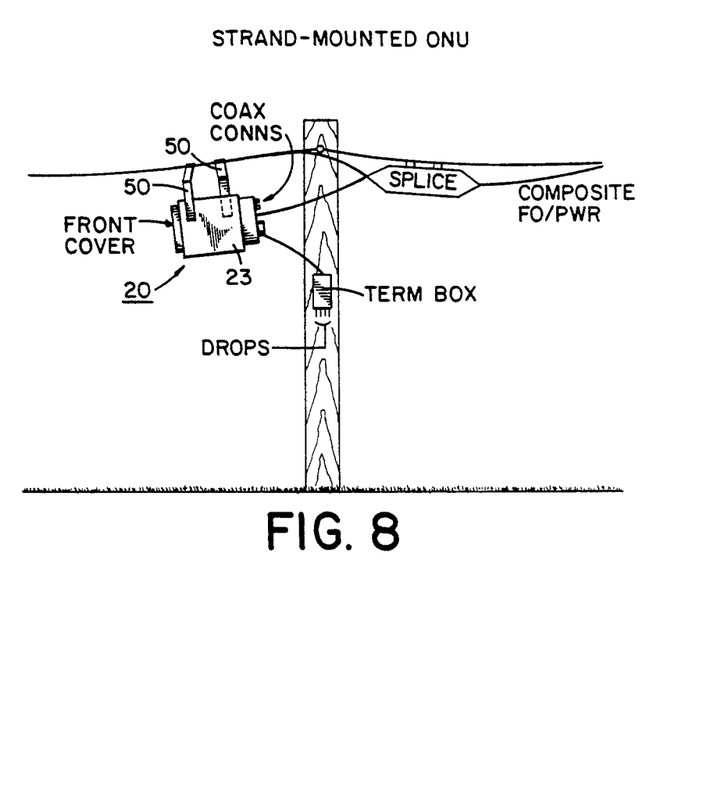
FIG. 8 shows a strand mounted ONU suspended from an overhead cable.
Figure 9:
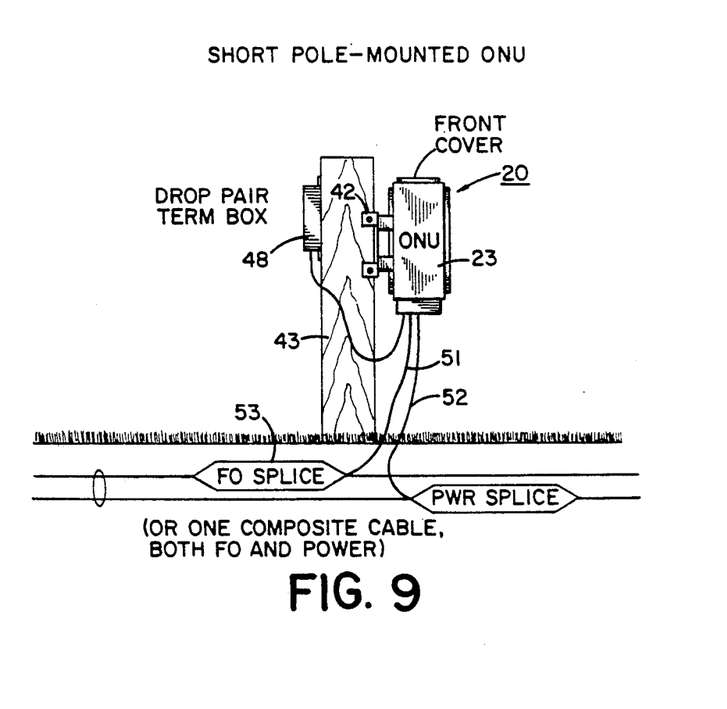
FIG. 9 shows an above ground mounting of an ONU on a short pole with an adjacent drop pair terminal box.
Figure 10:
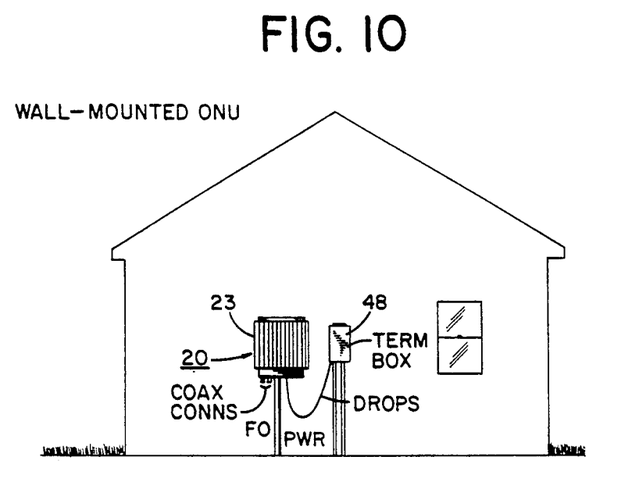
FIG. 10 shows a wall mounted ONU with a similar terminal box mounted adjacent to the ONU housing.
Figure 17:
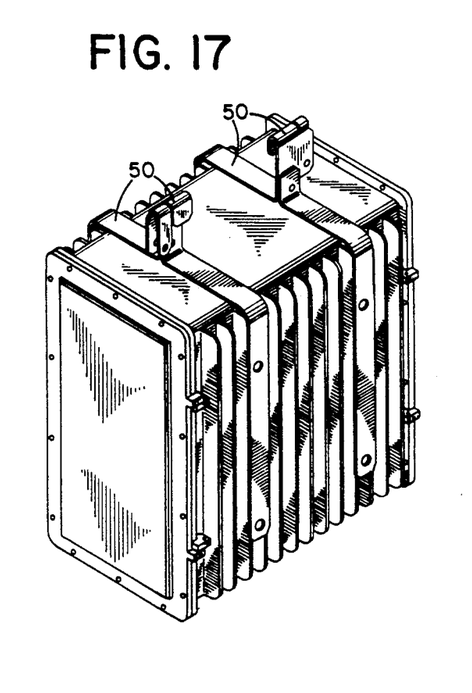
FIG. 17 shows cable clamps for aerial strand mounting.
Figure 18:
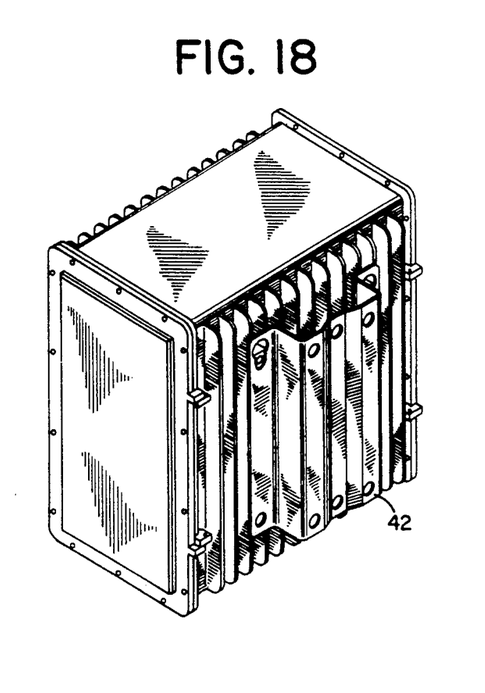
FIG. 18 shows mounting brackets for pole or wall mounting.

As indicated in FIGS. 8-12, the housings 23 of each ONU 20 of the present invention may be mounted in many different positions. They may be suspended high above the user's heads, depending from cable clamps 50 on an overhead cable as shown in FIGS. 8 and 17 or in several different above ground positions shown in FIGS. 9-12. They may be clamped by mounting brackets 42 to a utility pole or post 43 as illustrated in FIGS. 9 and 18. They may be mounted by similar clamps to a building wall as illustrated in FIG. 10.

Figure 11:
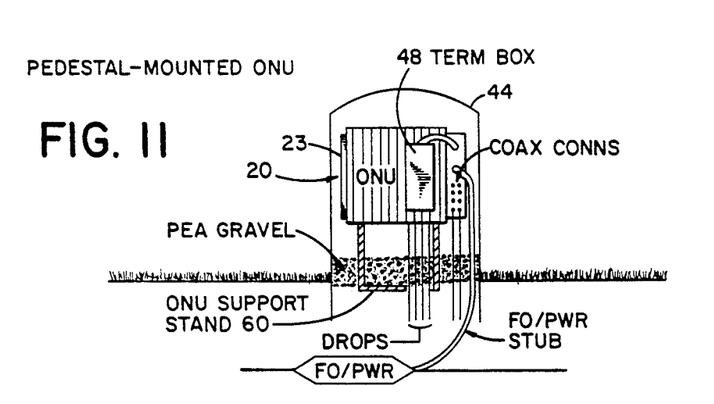
FIG. 11 shows a pedestal mounted ONU positioned above ground on support rods with a terminal box mounted on the ONU housing, all of these components being enclosed within a protective cover.
Figure 12:
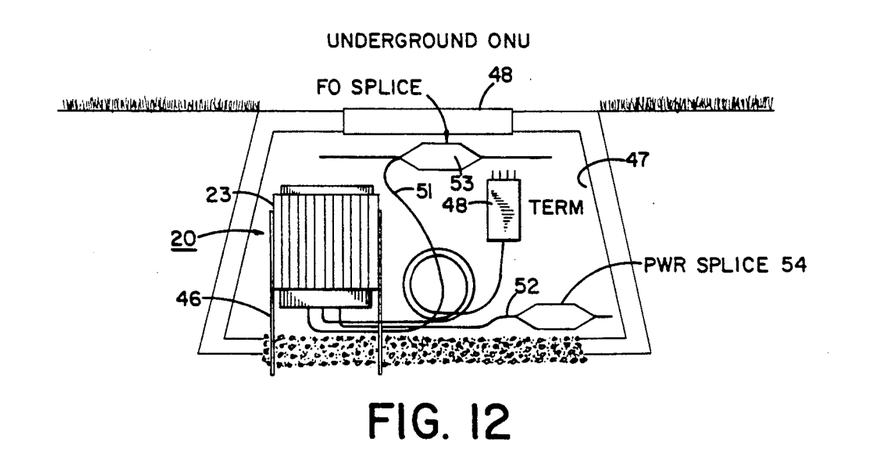
FIG. 12 shows an underground ONU mounting with the ONU housing on support rods and the adjacent terminal box being enclosed with fiber optic splice and a power splice inside a "handhole" underground chamber.

They may be mounted on a pedestal stand 60 (FIG. 16) or on support brackets 46 protruding upward from beneath the ground as shown in FIG. 11, enclosed by a suitable protective enclosure 44. The support stand or bracket preferably extends downward through a layer of gravel into firm embedded contact in the underlying earth, as shown in FIG. 11, with any buried anchors or footings desired. Finally, as shown in FIG. 12, an underground chamber 47 may be provided, accessible through a hand hole 48, with the ONU housing again being supported on a pedestal stand 60 (FIG. 16) or on support bracket 46 or other suitable supports.

Figure 16:
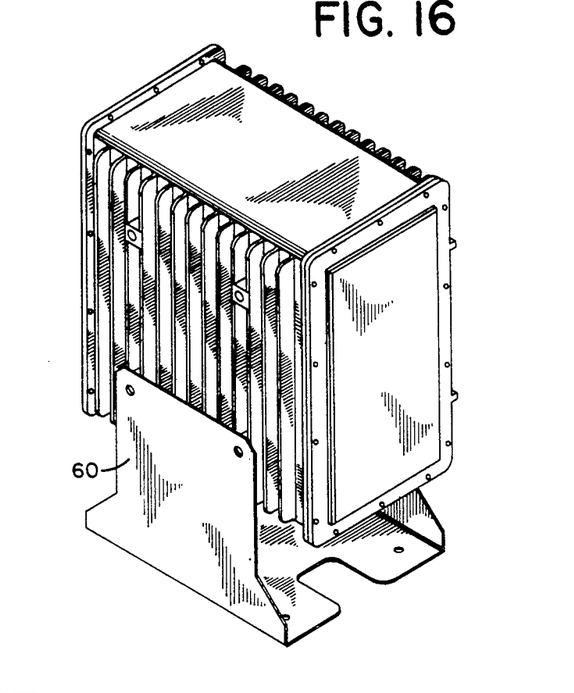
FIG. 16 shows a pedestal stand mount for underground hand hole or surface mounting.

Each ONU 20 may be packaged with a kit of mounting parts including cable clamps 50 and brackets 42 for wall or pole mounting, as well as support rods or brackets 46 or stand 60 for surface or underground mounting, thus offering a free choice of mounting locations (FIGS. 16, 17 and 18).

The card mounting grooves 29-31, 32-33 and 35-40 cooperate with back plane assembly 21 to provide solid support and effective electrical connections, eliminating all need for side plates, cross pieces, internal fasteners, card guides or cage pieces, thus making the ONUs 20 of this invention efficient and economical.

In each of these orientations, it will be noted that the incoming power and the incoming signal may be delivered through a combined fiber optic-power cable as in FIG. 8 and FIG. 11. On the other hand, the separate fiber optic cable may be tapped by means of a fiber optic splice 53 to bring the single fiber carrying the multiplexed signals into the ONU housing, as shown in FIG. 9 and FIG. 12, by a fiber optic cable stub 51, while the required power supplied by a separate power cable may be delivered by a power cable stub 52 from a power splice 54 entering the housing 23 through the power cable entrance 24.

Figure 13:
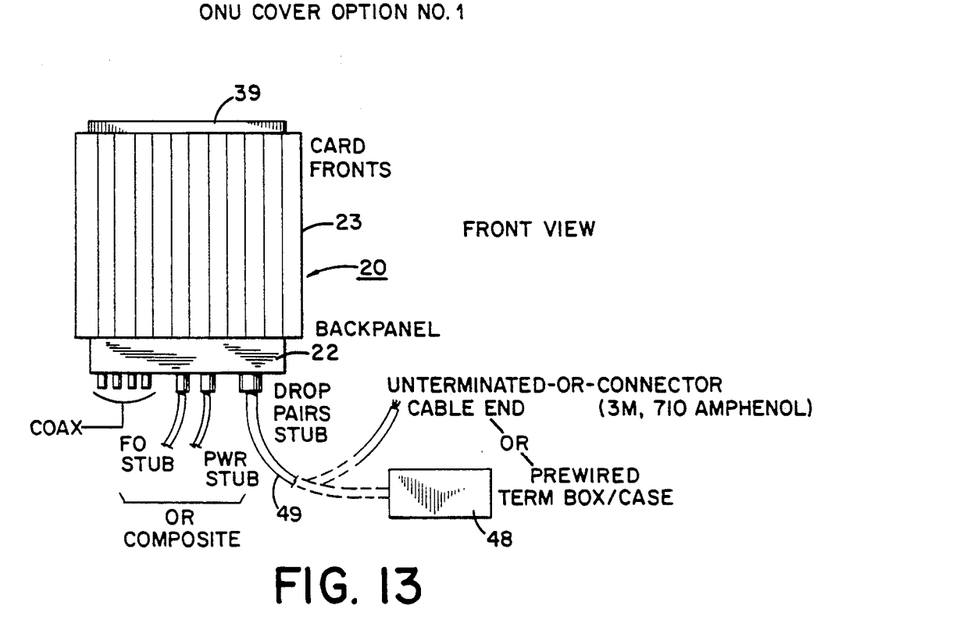
FIG. 13 shows an optional manner of employing the ONU housing with drop cable pairs provided with an unterminated cable end or a connector terminated end, or prewired into an adjacent terminal box.
Figure 14:
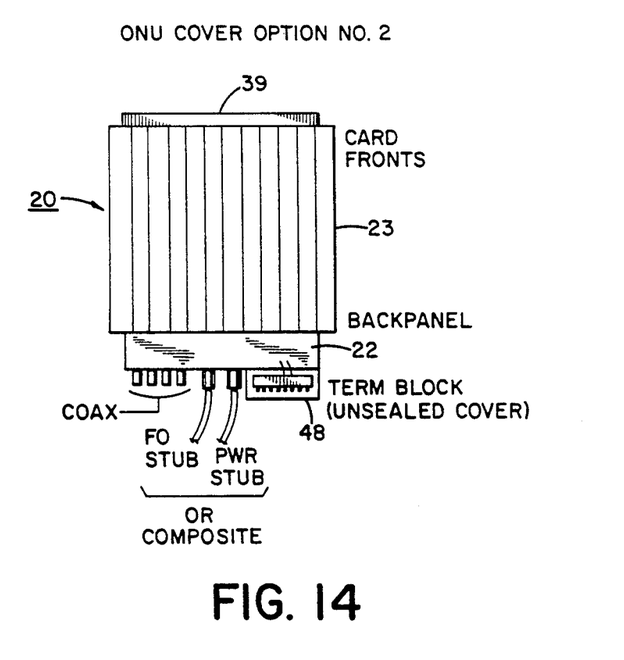
FIG. 14 shows a different optional manner of connecting the ONU housing with the subscriber's residence, with the twisted drop pair terminal box mounted directly on the back panel of the ONU housing.

The coaxial cables exiting the ONU for delivery of video signals are shown in FIG. 8, FIG. 10, FIG. 11 and FIG. 19, while the twisted pair terminal box 48 is shown separately but near the ONU housing 23 in FIGS. 8, 9, 10 and 12, and mounted directly on the ONU housing 23 in the pedestal mounted ONU 20 of FIG. 11. Terminal box 48 mounted directly on the ONU 20 is similarly shown in FIG. 14 while the separate terminal box 45 connected by drop pair stub cable 49 is shown in FIG. 13.

It will be noted in FIGS. 9, 10 and 12 to 14 that the optical network units 20 of the invention can be turned 90°, with their front covers 39 facing upward and their rear covers 22 facing downward, whenever desired to simplify stub cable connections to the portals of rear cover 22 or to the cables 62 from the cable entrance plate 57.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

The invention accordingly comprises the features of construction, combinations of elements, and arrangements of parts which will be exemplified in the construction hereinafter set forth, and the scope of the invention will be indicated in the claims.

What is claimed is:

1. An optical network unit for field installation adjacent to an optical fiber transmission line, for separating multiplexed video and telphony signals for delivery to subscribers' residences as electrical signals over metallic drop cables, comprising:
    a hollow housing formed of heat-conductive material with an open from end and an open rear end,
    a front cover dimensioned for removable mating installation on the housing for sealingly closing the open front end,
    a rear cover dimensioned for removable mating installation on the housing for sealingly closing the open rear end,
    cable entrance port means formed in said housing accommodating cables connecting with the transmission line and the subscribers' residences,
    a backplane assembly mounted in said housing near its rear end incorporating optical-to-electrical signal conversion components and connectors for electrical signals,
    card-supporting slot means formed in the interior surfaces of the housing, positioning a plurality of printed circuit board cards for sliding installation therein into electrical contact with said backplane assembly,
    a plurality of thin, flat internal fins each protruding inward from an outer wall of the housing into and partway across its hollow interior adjacent to one of the plurality of printed circuit board cards, and presenting exposed fin surface area closely juxtaposed to a major portion of the exposed area of said one printed circuit board card,
    whereby printed circuit board cards are readily installed by insertion through the open front housing end into sliding engagement with said slot means, and heat produced by the printed circuit board cards within the housing after its open ends are sealed by said covers is delivered by radiation to said closely juxtaposed fins and by internal convection between said internal fins and cards and thence to the hollow housing from which it is dissipated to the ambient atmosphere primarily by radiation and convection.

2. The optical network unit defined in claim 1 wherein the front cover and the rear cover are both installed on the housing by captive fastening means.

3. The optical network unit defined in claim 1, further including separate sealing gasket means clamped between each cover and the housing, assuring that the sealed housing is air-tight and moisture proof.

4. The optical network unit defined in claim 1, wherein said slot means includes a plurality of pairs of edge slots spaced apart by the width of a printed circuit board and positioned for sliding insertion of each circuit board with its opposite edges engaging the slots of one pair.

5. The optical network unit defined in claim 1 wherein said internal fins include individual fins each extending closely juxtaposed and substantially parallel to a printed circuit board.

6. The optical network unit defined in claim 5 wherein the external surfaces of said individual internal fins are black for maximum absorption of radiant heat from said printed circuit boards.

7. The optical network unit defined in claim 1 wherein said housing is also provided with externally protruding fins projecting outward from a major portion of the outer wall surfaces of said housing, promoting radiation and convection cooling thereof.

8. The optical network unit defined in claim 1 wherein the card-supporting slot means provide the sole support and accurate positioning for all printed circuit board cards positioned in said housing, whereby conventional circuit board cage parts, guides, side plates, cross pieces, fasteners and like piece parts are made unnecessary.

9. The optical network unit defined in claim 1 wherein the cable entrance port means is formed in said rear cover.

10. The optical network unit defined in claim 1 wherein the cable entrance port means is formed in a wall portion of said housing and incorporates a common gasketed entrance portal accommodating all of said connecting cables.

11. The optical network unit defined in claim 7, further including mounting means for positioning the housing, with its sealing covers installed, adjacent to the optical fiber transmission line, with its housing having its externally protruding fins fully exposed in heat-dissipating relationship with the ambient atmosphere.

12. The optical network unit defined in claim 11 wherein said mounting means are cable clamps suspending the unit from said transmission line.

13. The optical network unit defined in claim 11 wherein said mounting means comprises a support bracket having a lower end embedded in the ground and an upper end supporting said unit.

14. The optical network unit defined in claim 13 wherein said unit is mounted below the earth's surface in an underground hand hole chamber.

15. The optical network unit defined in claim 13 wherein said unit is mounted above the earth's surface, inside a protective enclosure.

16. The optical network unit defined in claim 11 wherein said mounting means are mounting bracket means anchoring the unit to a substantially vertical solid surface.

17. The optical network unit defined in claim 1, wherein at least one said fin has first and second exposed side surfaces, said first surface being closely juxtaposed to said one adjacent printed circuit board card, and said second surface being remotely spaced away from the next adjacent printed circuit board card, providing convective air circulation space therebetween.

18. The optical network unit defined in claim 1, wherein at least one said internal fin is divided into a pair of separate edgewise-aligned internal fin portions each extending from the outer housing wall partway across the hollow interior of the housing toward the opposite internal fin portion of said pair, and said pair of fin portions together presenting exposed fin surface area closely juxtaposed to a major portion of the exposed area of said one printed circuit board card.

* * * * *

UNITED STATES PATENT AND TRADEMARK OFFICE
CERTIFICATE OF CORRECTION

PATENT NO.    : 5,267,122
DATED         : November 30, 1993
INVENTOR(S)   : Glover et al It is certified that error appears in the above-identified patent and that said Letters Patent is hereby corrected as shown below:

Abstract, Item 57, lines 4-5, please change "subscribers" to --subscribers'--.

Signed and Sealed this

Twenty-sixth Day of July, 1994

Attest:

BRUCE LEHMAN

Attesting Officer       Commissioner of Patents and Trademarks